(12) United States Patent
Cheng et al.

(10) Patent No.: US 9,583,900 B2
(45) Date of Patent: Feb. 28, 2017

(54) FLIPPABLE ELECTRICAL CONNECTOR

(71) Applicant: FOXCONN INTERCONNECT TECHNOLOGY LIMITED, Grand Cayman (KY)

(72) Inventors: Chih-Pi Cheng, New Taipei (TW); Wen He, Shenzhen (CN); Qi-Jin Yi, Shenzhen (CN); Feng Zeng, Shenzhen (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/169,004

(22) Filed: May 31, 2016

(65) Prior Publication Data

US 2016/0276789 A1 Sep. 22, 2016

Related U.S. Application Data

(63) Continuation of application No. 14/698,876, filed on Apr. 29, 2015, now Pat. No. 9,356,400, which is a
(Continued)

(30) Foreign Application Priority Data

Jun. 18, 2015 (CN) .......................... 2015 1 0339562

(51) Int. Cl.
*H01R 24/00* (2011.01)
*H01R 24/60* (2011.01)
(Continued)

(52) U.S. Cl.
CPC ............. *H01R 24/60* (2013.01); *H01R 4/023* (2013.01); *H01R 12/53* (2013.01);
(Continued)

(58) Field of Classification Search
CPC ........................ H01R 23/7303; H01R 23/7005
(Continued)

(56) References Cited

U.S. PATENT DOCUMENTS 5,073,130 A 12/1991 Nakamura
6,139,363 A * 10/2000 Ko .......................... H01R 43/16
439/579

(Continued)

FOREIGN PATENT DOCUMENTS

CM CN201868687 U 6/2011
CN 2454802 Y 10/2001
(Continued)

OTHER PUBLICATIONS

USB Type-C Specification 0.9c05—May 18, 2014.
(Continued)

*Primary Examiner* — Phuongchi T Nguyen
(74) *Attorney, Agent, or Firm* — Wei Te Chung; Ming Chieh Chang

(57) ABSTRACT

A plug connector includes a front housing, a first and a second terminal module each including an insulator insert molded with terminals. The front housing defines a rear wall, a front mating cavity opening forwards, and a plurality of terminal passageways running through the rear wall in a front and rear direction and the front housing in a vertical direction a first terminal module, The terminals comprising contacting portions received in the corresponding terminal passageways. The shell fitly encloses the front housing and the insulators. The front housing unitarily defines a plurality of protection flanges, each protection flange is located above a front end of each terminal passageway and each contacting section is located inside the protection flange thereby ensuring the contacting sections separating from the shell during
(Continued)

the contacting sections are pushed outwards by an insertion of a mating receptacle connector.

9 Claims, 17 Drawing Sheets

Related U.S. Application Data continuation-in-part of application No. 14/667,632, filed on Mar. 24, 2015, and a continuation-in-part of application No. 14/558,732, filed on Dec. 3, 2014, and a continuation-in-part of application No. 14/542,550, filed on Nov. 15, 2014, now Pat. No. 9,350,126, and a continuation-in-part of application No. 14/497,205, filed on Sep. 25, 2014, and a continuation-in-part of application No. 14/477,889, filed on Sep. 5, 2014, and a continuation-in-part of application No. 14/454,737, filed on Aug. 8, 2014, and a continuation-in-part of application No. 14/337,180, filed on Jul. 21, 2014, now Pat. No. 9,318,853, and a continuation-in-part of application No. 14/517,941, filed on Oct. 20, 2014.

(60) Provisional application No. 62/021,066, filed on Jul. 4, 2014, provisional application No. 62/002,934, filed on May 26, 2014, provisional application No. 62/026,046, filed on Jul. 18, 2014, provisional application No. 62/035,472, filed on Aug. 10, 2014, provisional application No. 61/977,115, filed on Apr. 9, 2014, provisional application No. 61/940,815, filed on Feb. 17, 2014, provisional application No. 61/943,310, filed on Feb. 22, 2014, provisional application No. 61/949,232, filed on Mar. 6, 2014, provisional application No. 61/917,363, filed on Dec. 18, 2013, provisional application No. 61/926,270, filed on Jan. 11, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.
| | | |
|---|---|---|
| *H01R 13/405* | (2006.01) | |
| *H01R 12/53* | (2011.01) | |
| *H01R 13/627* | (2006.01) | |
| *H01R 4/02* | (2006.01) | |
| *H01R 13/6583* | (2011.01) | |
| *H01R 24/30* | (2011.01) | |
| *H01R 13/6582* | (2011.01) | |
| *H01R 12/72* | (2011.01) | |
| *H01R 107/00* | (2006.01) | |
| *H05K 1/11* | (2006.01) | |
| *H05K 1/18* | (2006.01) | |
| *H01R 13/6474* | (2011.01) | |

(52) U.S. Cl.
CPC ....... *H01R 13/405* (2013.01); *H01R 13/6273* (2013.01); *H01R 13/6275* (2013.01); *H01R 13/6582* (2013.01); *H01R 13/6583* (2013.01); *H01R 24/30* (2013.01); *H01R 12/724* (2013.01); *H01R 13/6474* (2013.01); *H01R 2107/00* (2013.01); *H05K 1/117* (2013.01); *H05K 1/184* (2013.01); *H05K 2201/09063* (2013.01); *H05K 2201/10189* (2013.01)

(58) Field of Classification Search
USPC .................. 439/660, 626, 374, 377, 79, 733
See application file for complete search history.

(56) References Cited

U.S. PATENT DOCUMENTS

| | | | |
|---|---|---|---|
| 6,489,563 B1* | 12/2002 | Zhao | H01R 9/0524 174/88 C |
| 6,755,689 B2 | 6/2004 | Zhang et al. | |
| 7,534,150 B2* | 5/2009 | Shen | H01R 12/712 439/752 |
| 7,758,379 B2 | 7/2010 | Chen | |
| 8,087,944 B2 | 1/2012 | Kumamoto et al. | |
| 8,517,773 B2 | 8/2013 | Lee et al. | |
| 8,968,031 B2 | 3/2015 | Simmel et al. | |
| 2007/0049100 A1 | 3/2007 | Tsai | |
| 2009/0156027 A1 | 6/2009 | Chen | |
| 2010/0267261 A1 | 10/2010 | Lin | |
| 2010/0297885 A1* | 11/2010 | Cao | H01R 4/028 439/626 |
| 2010/0311258 A1* | 12/2010 | Su | H01R 13/5213 439/136 |
| 2013/0095702 A1 | 4/2013 | Golko et al. | |
| 2014/0024257 A1 | 1/2014 | Castillo et al. | |
| 2015/0056839 A1 | 2/2015 | Zhang | |
| 2015/0155661 A1* | 6/2015 | Chen | H01R 13/6594 439/607.01 |
| 2015/0162684 A1 | 6/2015 | Amini et al. | |
| 2015/0171562 A1 | 6/2015 | Gao et al. | |
| 2015/0214673 A1 | 7/2015 | Gao et al. | |
| 2015/0214674 A1 | 7/2015 | Simmel et al. | |
| 2015/0295362 A1 | 10/2015 | Tziviskos et al. | |
| 2015/0340813 A1 | 11/2015 | Ng et al. | |
| 2015/0340815 A1 | 11/2015 | Gao et al. | |
| 2015/0340825 A1 | 11/2015 | Ng et al. | |

FOREIGN PATENT DOCUMENTS

| | | |
|---|---|---|
| CN | 2728006 Y | 9/2005 |
| CN | 201029143 Y | 2/2008 |
| CN | 201230066 Y | 4/2009 |
| CN | 101573840 A | 11/2009 |
| CN | 201623280 U | 11/2010 |
| CN | 201741935 U | 2/2011 |
| CN | 201741937 U | 2/2011 |
| CN | 102437482 A | 5/2012 |
| CN | 102544812 A | 7/2012 |
| CN | 202423735 U | 9/2012 |
| CN | 202737282 U | 2/2013 |
| CN | 103081253 A | 5/2013 |
| CN | 203242848 U | 10/2013 |
| CN | 103427263 A | 12/2013 |
| CN | 203481540 U | 3/2014 |
| TW | M288035 | 2/2006 |
| TW | M357077 | 5/2009 |
| TW | I427870 | 6/2011 |
| TW | M414692 | 10/2011 |
| TW | M443957 | 12/2012 |
| TW | M453995 | 5/2013 |
| TW | M454654 | 6/2013 |
| WO | WO2009147791 | 12/2009 |
| WO | WO2013/020359 | 2/2013 |

OTHER PUBLICATIONS

Universal Serial Bus Type-C Cable and Connector Specification Revision 0.7 Working Draft Jan. xx, 2014.

(56) References Cited

OTHER PUBLICATIONS

Universal Serial Bus Type-C Cable and Connector Specification Revision 1.0 Aug. 11, 2014.

* cited by examiner

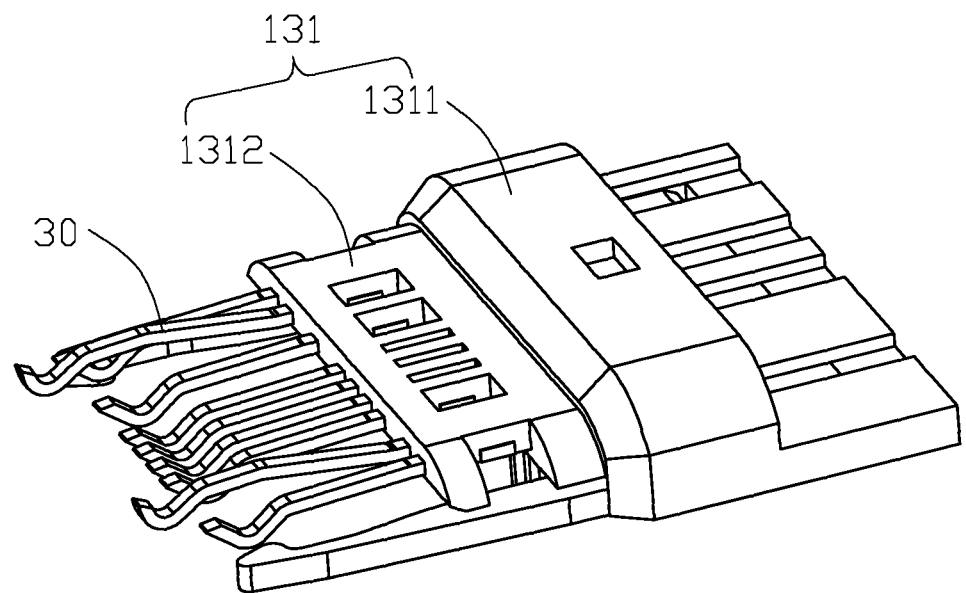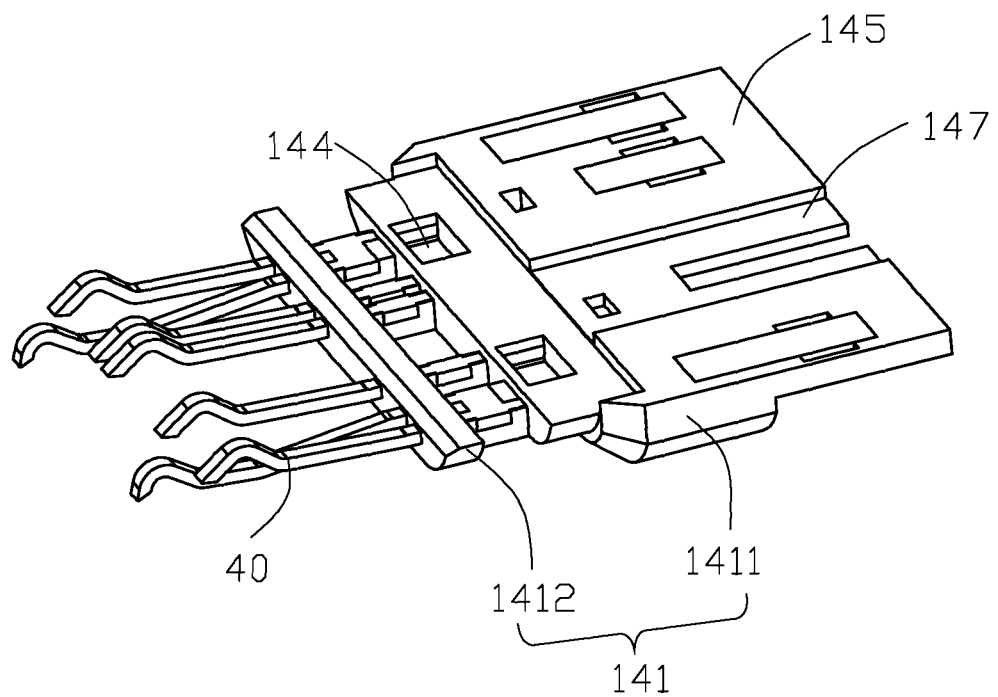
FIG. 13

US 9,583,900 B2

FLIPPABLE ELECTRICAL CONNECTOR

CROSS REFERENCE TO CROSS REFERENCE TO RELATED APPLICATIONS

This application is a continuation in part of application Ser. No. 14/698,876 filed on Apr. 29, 2015, which is a continuation-in-part of the co-pending application Ser. No. 14/667,632 filed Mar. 24, 2015 and application Ser. No. 14/558,732 filed Dec. 3, 2014 and further claims the benefit of, and priority to, U.S. Provisional Patent Application No. 62/002,934, filed May 26, 2014, No. 62/021,066, filed Jul. 4, 2014, No. 62/026,046 filed Jul. 18, 2014, and No. 62/035,472 filed Aug. 10, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

USB 3.0 Promoter Group issues a new specification which establishes a new type connector named as USB Type-C Cable and Connector, on Aug. 11, 2014. In the specification, the Type-C plug enhances ease of use by being plug-able in either upside-up or upside-down directions. The plug connector connecting with a cable defines two types, one type is USB Full-Featured Type-C Plug Interface with 22 pins, another type is USB 2.0 Type-C plug with 14 pins. The plug connector is connected to the cable via paddle card, which will enhance the whole cost of the cable connector.

Hence, a new and simple electrical plug connector and the complementary receptacle connector are desired to improve those disclosed in the aforementioned proposal.

SUMMARY OF THE INVENTION

Accordingly, the object of the present invention is to provide to a plug connector, the plug connector comprises a front housing defining a rear wall, a front mating cavity opening forwards, and a plurality of terminal passageways running through the rear wall in a front and rear direction and the front housing in a vertical direction; a first terminal module including a first insulator insert molded with a plurality of first terminals, the first terminals comprising first contacting portions received in the corresponding terminal passageways; a second terminal module including a second insulator insert molded with a plurality of second terminals, the second terminals comprising second contacting portions received in the corresponding terminal passageways; and a metallic shell fitly enclosing the front housing and the insulators; wherein the front housing unitarily defines a plurality of protection flanges, each protection flange is located above a front end of each terminal passageway and each contacting section of the first and second contact is located inside the protection flange thereby ensuring the contacting sections separating from the metallic shell during the contacting sections are pushed outwards by an insertion of a mating receptacle connector.

Other objects, advantages and novel features of the invention will become more apparent from the following detailed description when taken in conjunction with the accompanying drawings.

BRIEF DESCRIPTION OF THE DRAWINGS

FIG. 13 is a front, further exploded perspective view of two terminal modules shown in FIG. 12;

DETAILED DESCRIPTION OF THE PREFERRED EMBODIMENT

Reference will now be made in detail to the preferred embodiment of the present invention.

Figure 1:
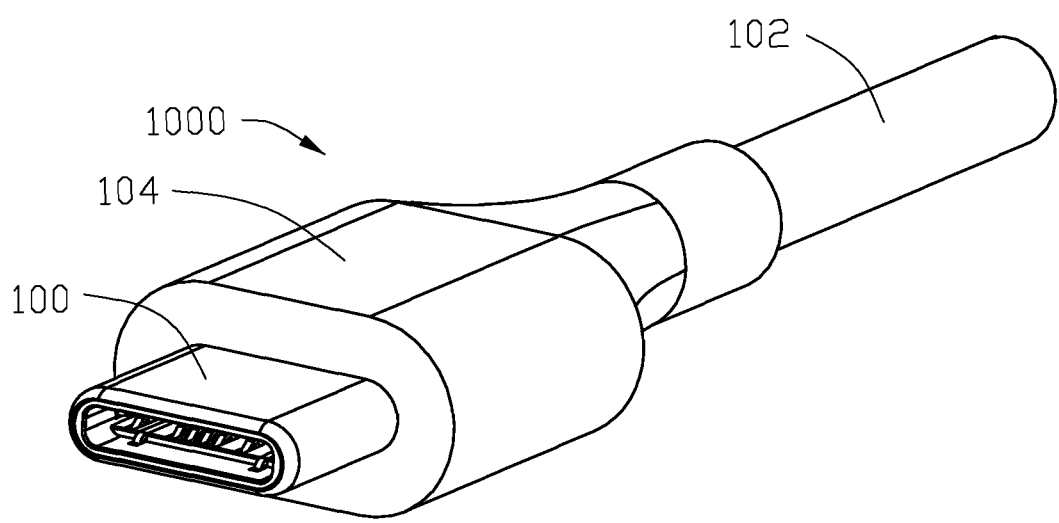
FIG. 1 is an assembled perspective view of a plug connector connecting with a cable of a preferred embodiment of the instant invention.
Figure 2:
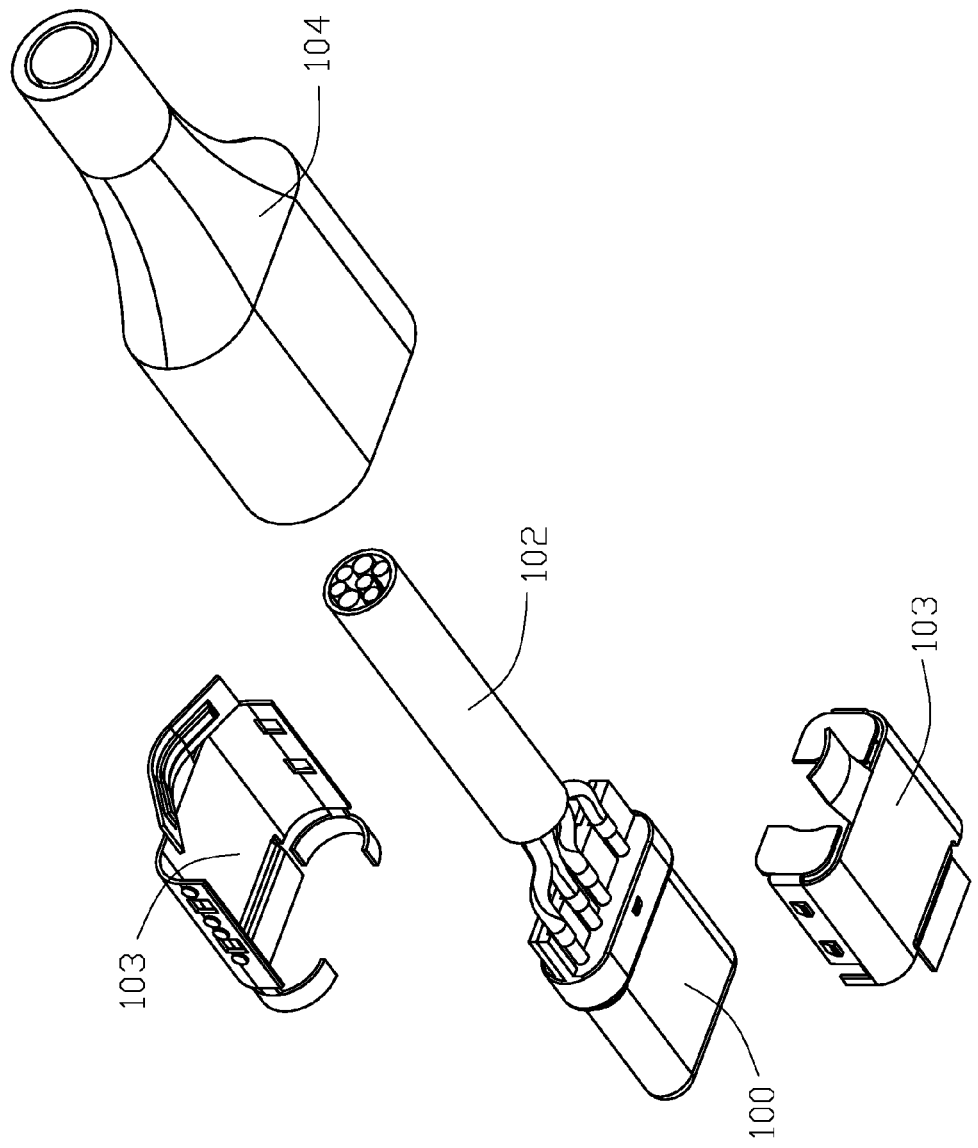
FIG. 2 is a partially exploded perspective view of the plug connector of FIG. 1.

Referring to FIGS. 1-2, a USB 2.0 Type C plug connector 1000 of the preferred embodiment of this present invention is illustrated, which defines a front connector body 100 and a rear cable 102, and a metallic outer shell 103 surrounding the connector body 100 and the cable 102 and an insulating cover 104 insert molded on the metallic outer shell 103 and the cable 102.

Figure 7:
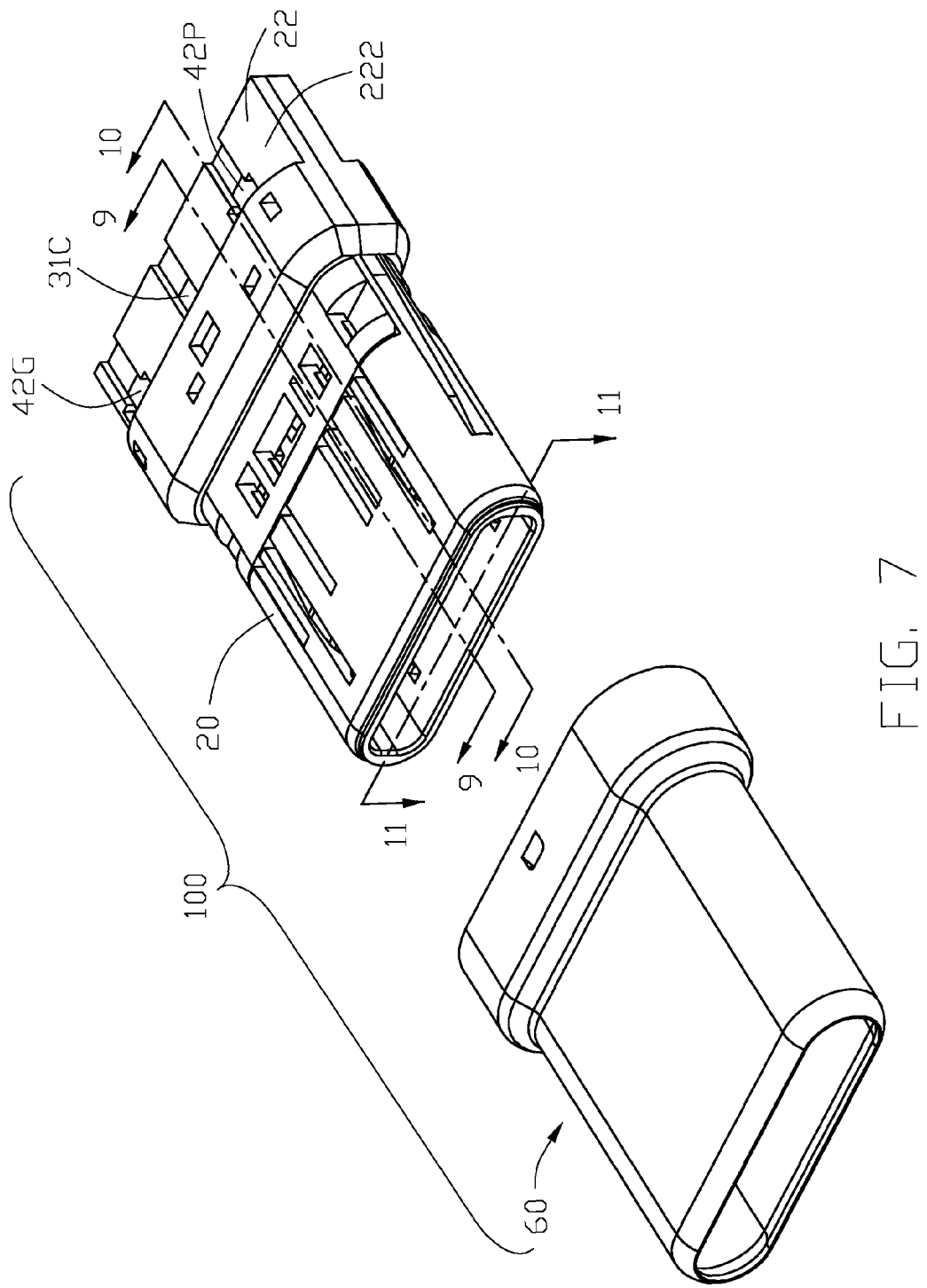
FIG. 7 is a front, further exploded perspective view of the connector head.
Figure 8:
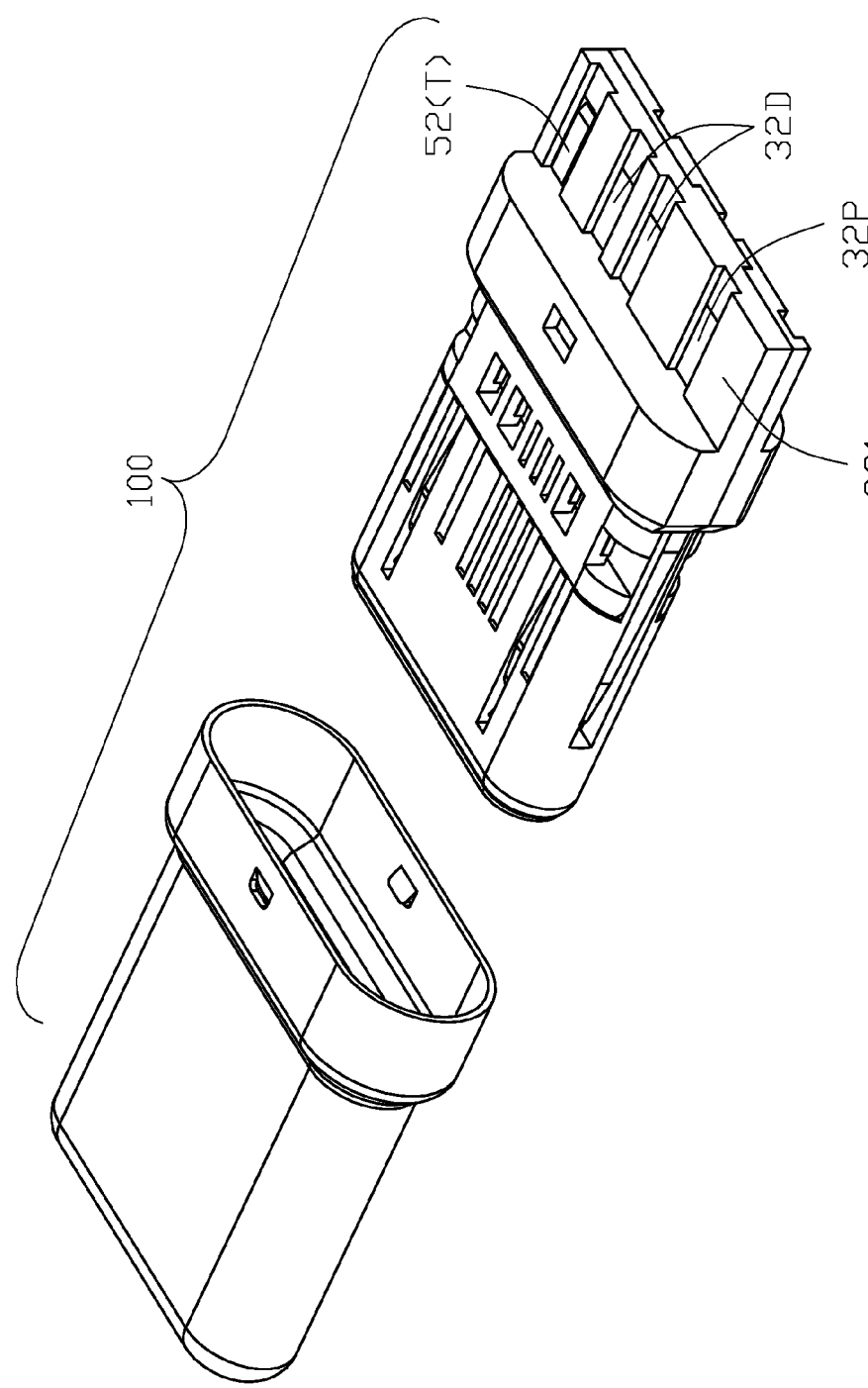
FIG. 8 is a rear exploded perspective view of the connector head shown in FIG. 7.
Figure 9:
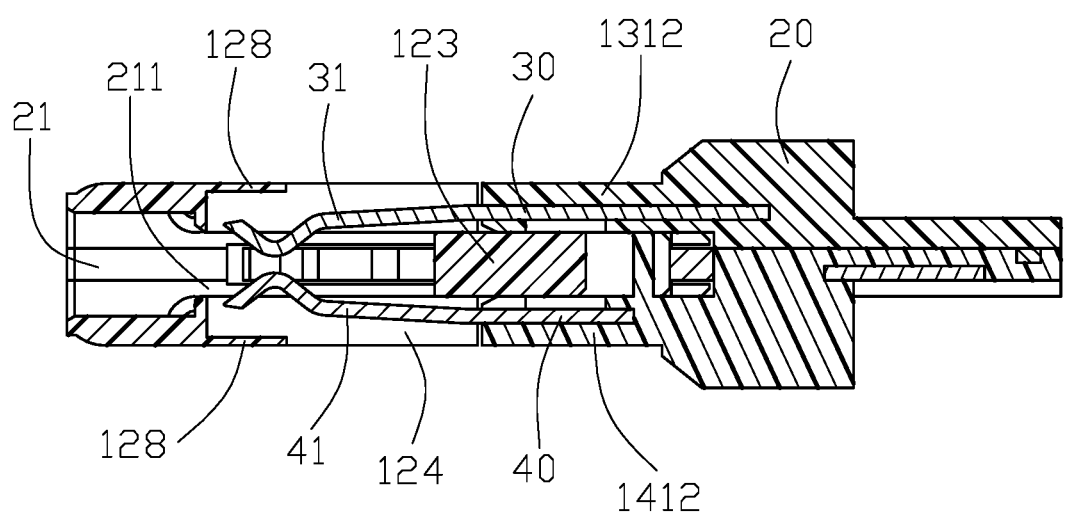
FIG. 9 is a cross sectional view of the plug connector taken along lines 9-9 shown in FIG. 7.
Figure 10:
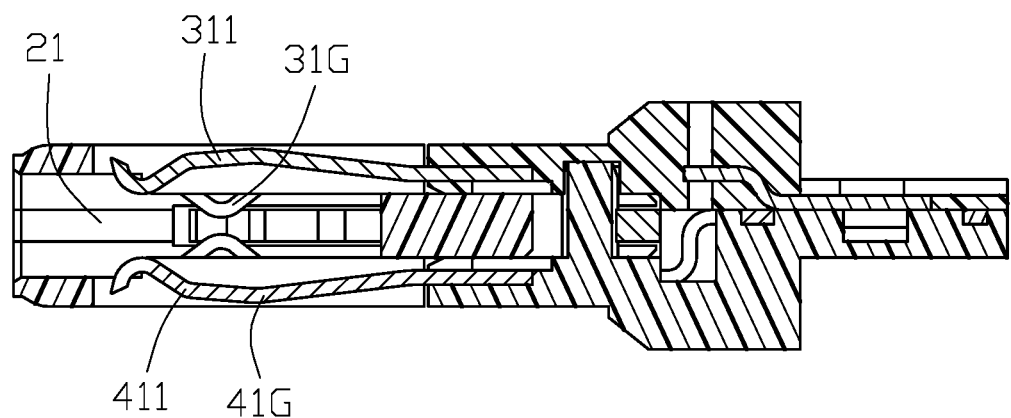
FIG. 10 is a cross sectional view of the plug connector taken along lines 10-10 shown in FIG. 7.
Figure 11:
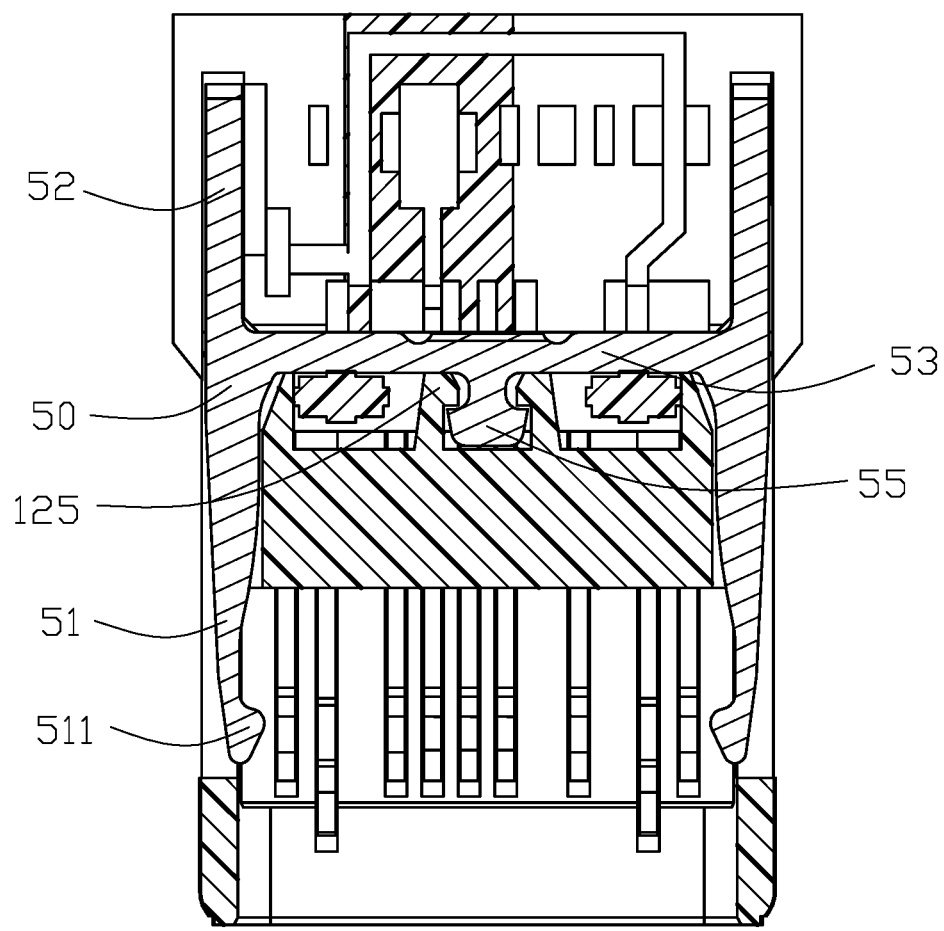
FIG. 11 is a cross sectional view of the plug connector taken along lines 11-11 shown in FIG. 7.

Referring to FIGS. 7-11, the connector body 100 includes an insulating housing 20, a row of first terminals 30, a row of second terminals 40, a metallic latch 50 and a metallic shell 60. Referring to FIGS. 9-11, the insulating housing 20 defines a mating cavity 21 opening forwards with opposite inner sides 211, the first terminals 30 and the second terminals 40 are located at the opposite inner sides 211 with contacting sections 31/41 extending into the mating cavity 21. The metallic latch 50 includes two side arms 51 located at two opposite lateral sides of the mating cavity 21 with latching heads 511 protruding into the mating cavity 21 and two leg sections 52 out of the insulating housing 20. The row of first terminals 30 are categorized with a pair of grounding terminals, a pair of power terminals, detecting terminals and a pair of USB 2.0 signal terminals. The row of second terminals 40 also are categorized with a pair of grounding terminals, a pair of power terminals and an additional detecting contact, without any USB 2.0 signal terminals. Each of the pair of USB 2.0 signal terminals includes a contacting section and a leg section. The power terminals or the grounding terminals include contacting sections to mate with corresponding terminals of a receptacle connector while share a same soldering leg by connecting the leg sections together, simply connecting with one corresponding wire of the cable 102.

Figure 14:
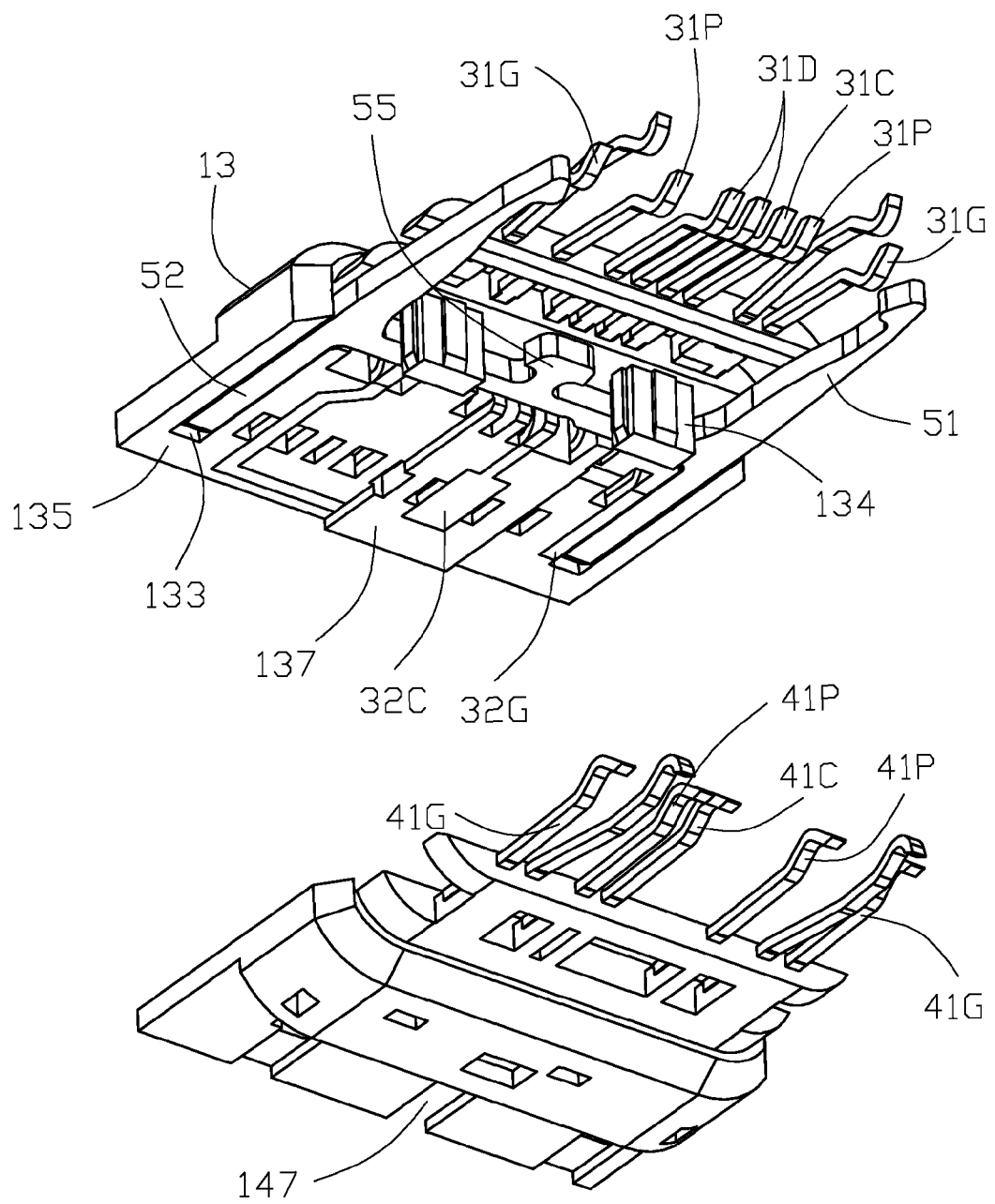
FIG. 14 is a rear exploded perspective view of two terminal modules shown in FIG. 13.
Figure 15:
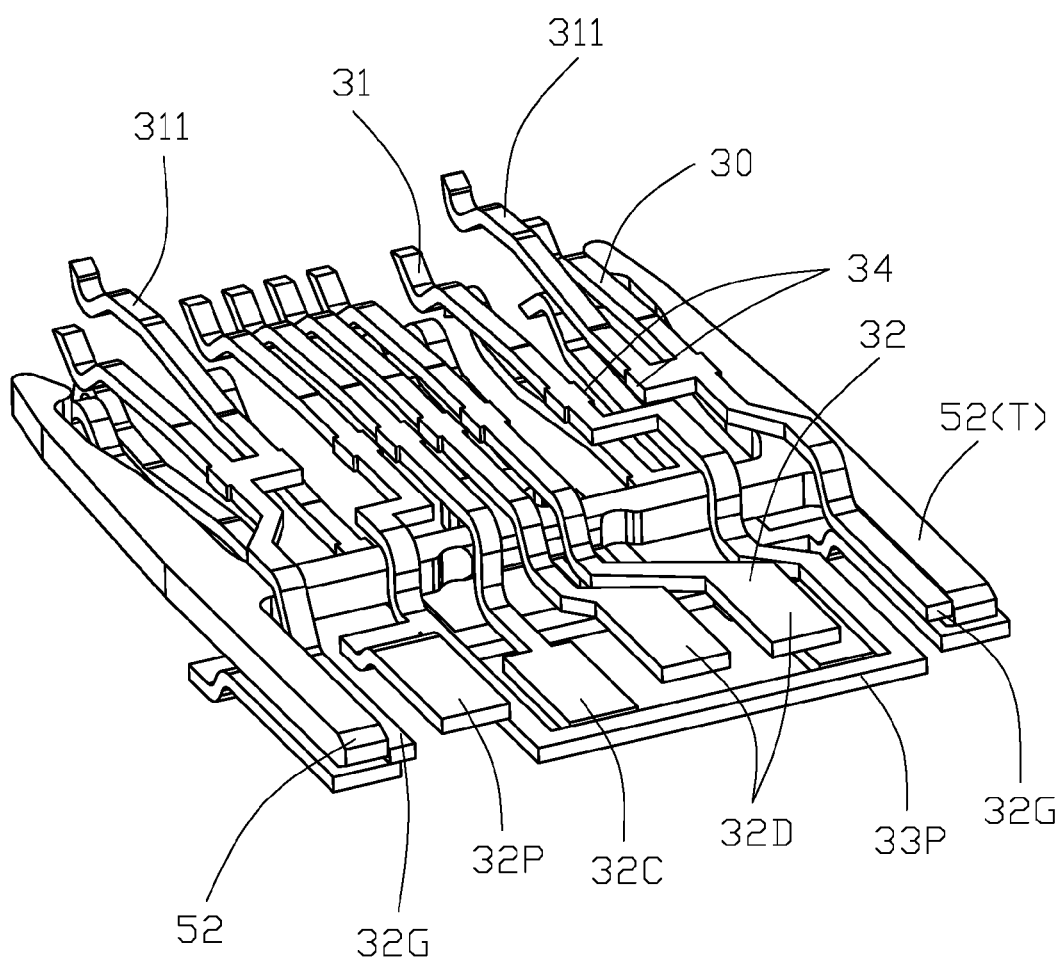
FIG. 15 is a rear perspective view of the terminals and the metallic latch of the plug connector.
Figure 16:
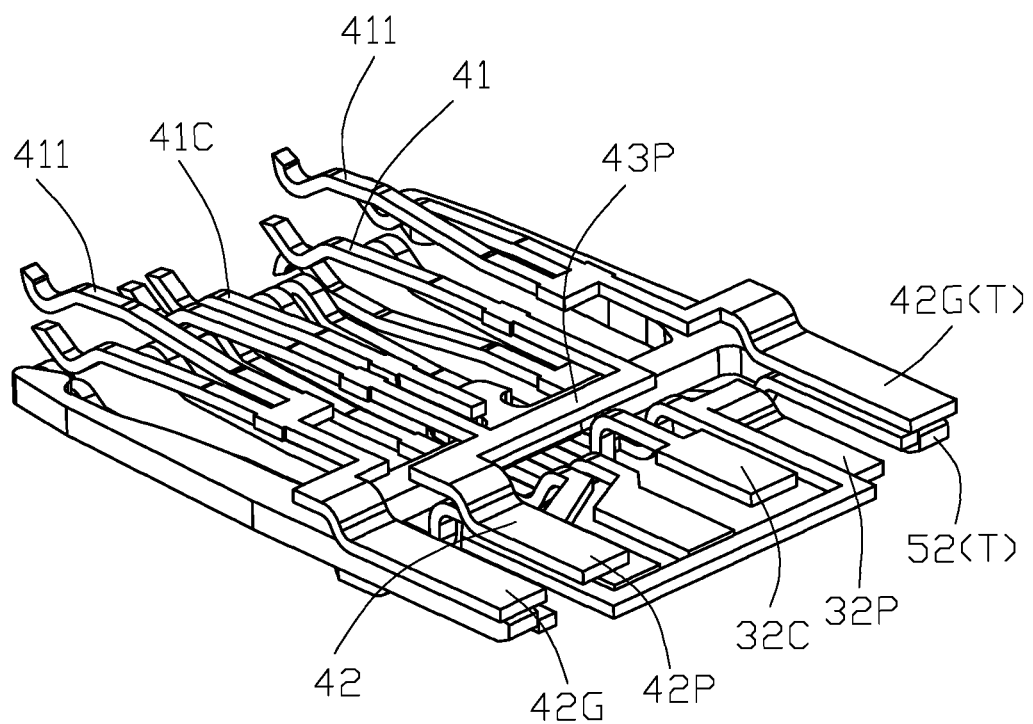
FIG. 16 is a front perspective view of the terminals and the metallic latch of the plug connector shown in FIG. 15.

Referring to FIGS. 15-16 combination with FIG. 14, the row of first terminals 30 includes a plurality of first contacting sections 31 and a plurality of first leg section 32. The row of second terminals 40 includes a plurality of second contacting sections 41 and a plurality of second leg sections 42. The plurality of first contacting sections includes a pair of USB 2.0 contacting sections 31D, a pair of first power contacting sections 31P, a pair of first grounding contacting sections 31G, a detecting contacting section 31C which are arranged in a G-P-D-D-C-P-G pattern. The plurality of first leg sections 32 includes a pair of USB 2.0 contacting sections 32D, a pair of first power leg section 32P, a pair of first grounding leg section 312G, a detecting leg section 32C. The detecting contacting section 31C is located beside the USB 2.0 contacting sections 31D, the two first grounding contacting sections 32G are located at outermost sides of the row of the first contacting sections 31. The two first power contacting sections 31P are disposed inside of the two first grounding contacting sections 31G. Each grounding contact includes a grounding contacting section and a leg section. The two power terminals of each row joint together by a connecting section 33P at rear portions thereof and one power leg portion 32P extend rearwards from the connecting section 33P.

The plurality of second contacting sections 41 includes a pair of second power contacting sections 41P, a pair of second grounding contacting sections 41G. The plurality of the second leg sections 42 includes a second power leg portion 42P and a pair of second grounding leg sections 42G. The plurality of second contacting sections 41 further includes an additional detecting contacting section 41C without any leg portions. The additional detecting terminal can be canceled because of no function.

The legs 52 of the latch 50 are located at outermost sides of the plurality of the first leg sections 32. The latching heads 511 are used to lock with two side latching notches of a shielding plate of the mating receptacle connector for locking engagement between and establishing a grounding trace between the two connectors. Therefore, the leg sections 52 connect with grounding traces on the grounding leg portions. Referring to FIGS. 14-16, the two USB leg sections 32D, the one first power leg section 32P and the one first leg section 52(T) of the latch are arranged in a first or top plane plane. The one detecting leg section 32C bends to near the second leg sections 42, so that the detecting leg section 32C, the one second grounding leg section 42G(T), the one second power leg section 42P are arranged in a second or lower plane plane, and other grounding leg sections 32G, 42G and the other leg section 52 of the metallic latch 50 are arranged in a third plane between the first and second plane. Understandingly, the grounding terminals and the latch 50 remain leg sections to electrically connecting with each other so as to improve electronic performance. Alternatively, the grounding terminals and the latch electrically and mechanically connect with each other at front portions thereof, without any leg section. The first grounding leg sections 32G are located inside of the leg sections 52 of the latch 50 side by side. The second grounding leg sections 42G shift to stack with the leg section 52 of the latch in the vertical direction. Collectively, the first power leg sections 32P are electrically connected with each other via the connecting portion 33P, the second power leg sections 42P are electrically connected with each other via the connecting portion 43P. The first and second grounding leg sections 32G, 42G are adjoin with each other in a stacked pattern in the vertical direction and in a side-by-side pattern along a transverse direction perpendicular to the vertical direction As shown in FIGS. 7 and 8, the insulating housing 20 includes a cable supporting platform 22 in a board shape which defines a first supporting surface 221 and a second supporting surface 222, at a rear end thereof. The leg sections including the two USB leg sections 32D, one first power leg section 32P and the first leg section 52(T) in the first plane expose to the first supporting surface 222 of the platform 22, which are provided as first soldering legs welded with the cable 102, the first soldering legs includes a pair of USB 2.0 soldering legs (i.e., USB 2.0 leg section 32D), a power soldering leg (i.e., first power leg section 32P), and a grounding soldering leg (i.e., first grounding leg section 52(T)). The leg sections including the detecting leg section 32C, the one second grounding leg section 42G(T), the one second power leg section 42P in the second plane expose to the second supporting surface 221 of the platform 22, which are provided as second soldering legs welded with the cable 102, the second soldering legs includes a power soldering leg (i.e., second power leg sections 42P), and a grounding soldering leg (i.e., second grounding leg section 42). Other leg sections are embedded in the platform 22. Understandingly, any one leg section of the grounding terminals and the latch can be the one grounding soldering leg.

Figure 3:
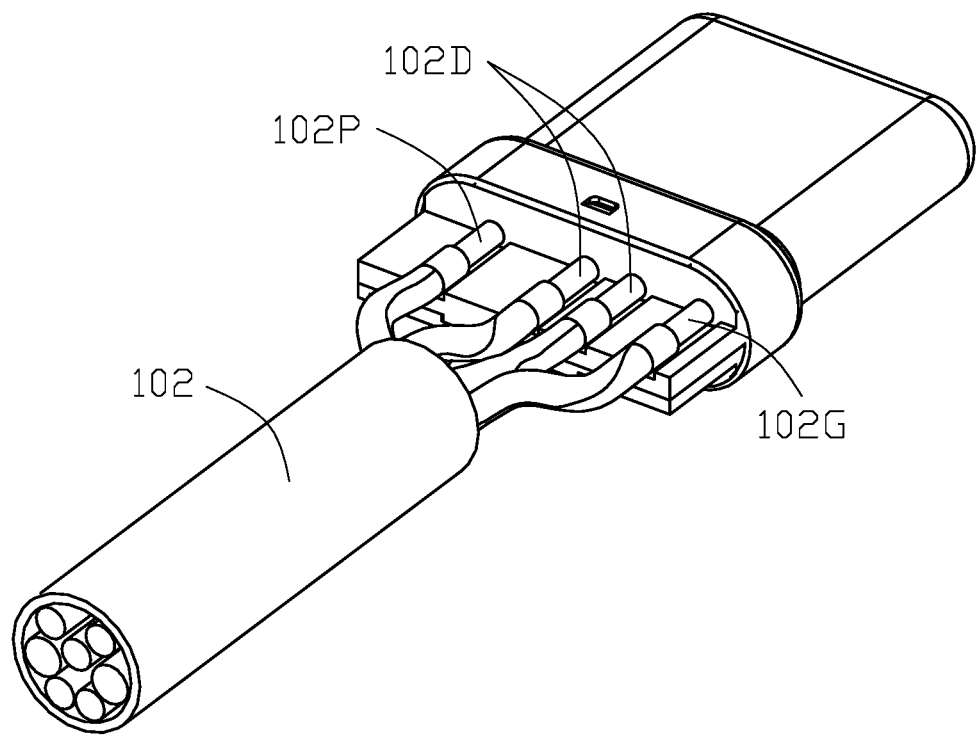
FIG. 3 is a rear and top perspective view of the plug connector of FIG. 2 wherein the cover and the outer shells are removed away.
Figure 4:
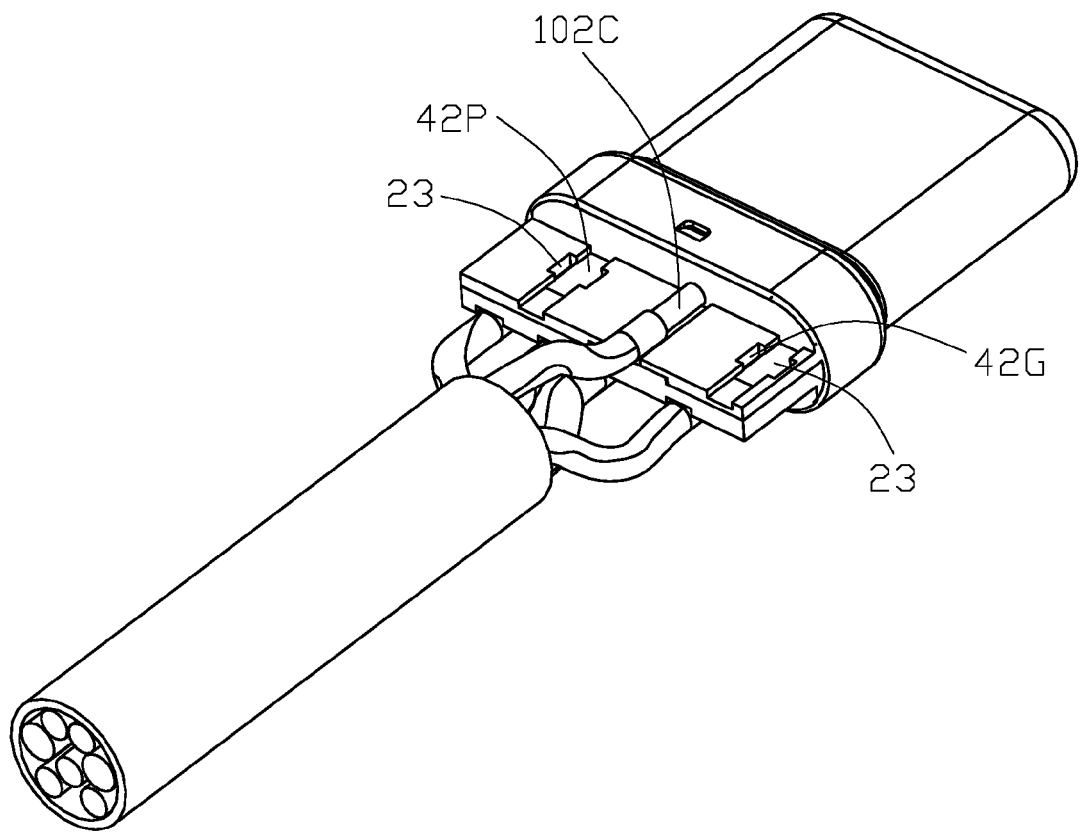
FIG. 4 is a rear and bottom perspective view of the plug connector shown in FIG. 3.
Figure 5:
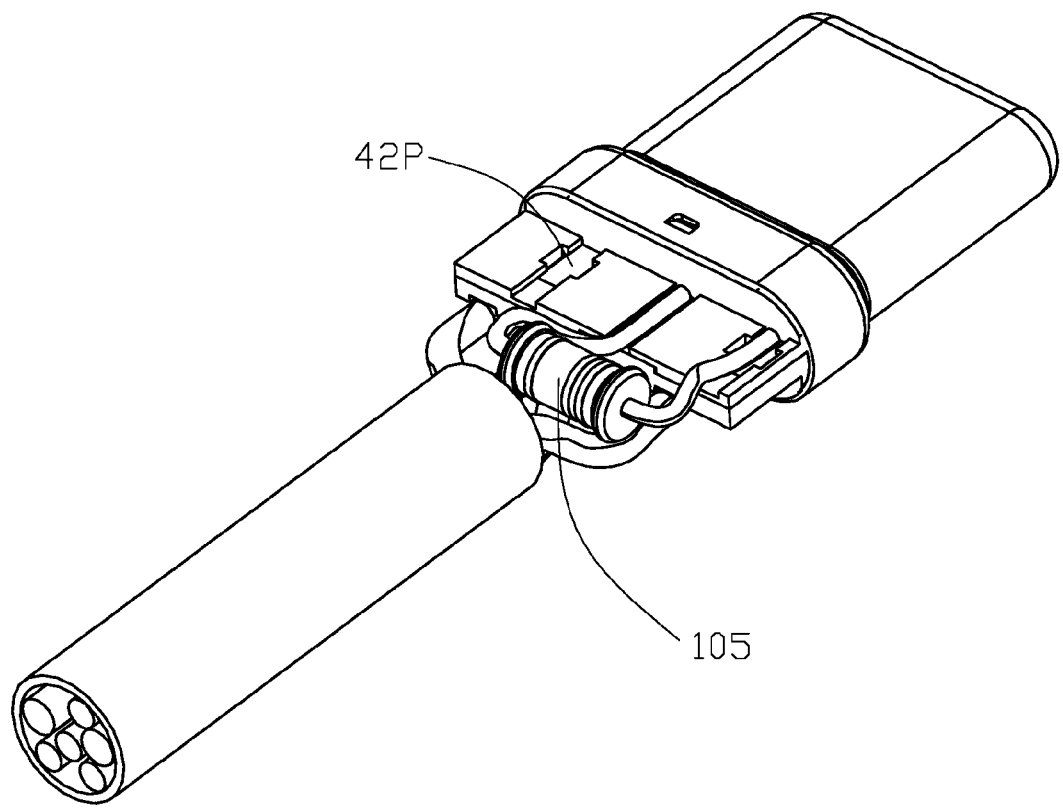
FIG. 5 is a perspective view of the plug connector with a resistor connecting with two soldering legs, shown in FIG. 4.
Figure 6:
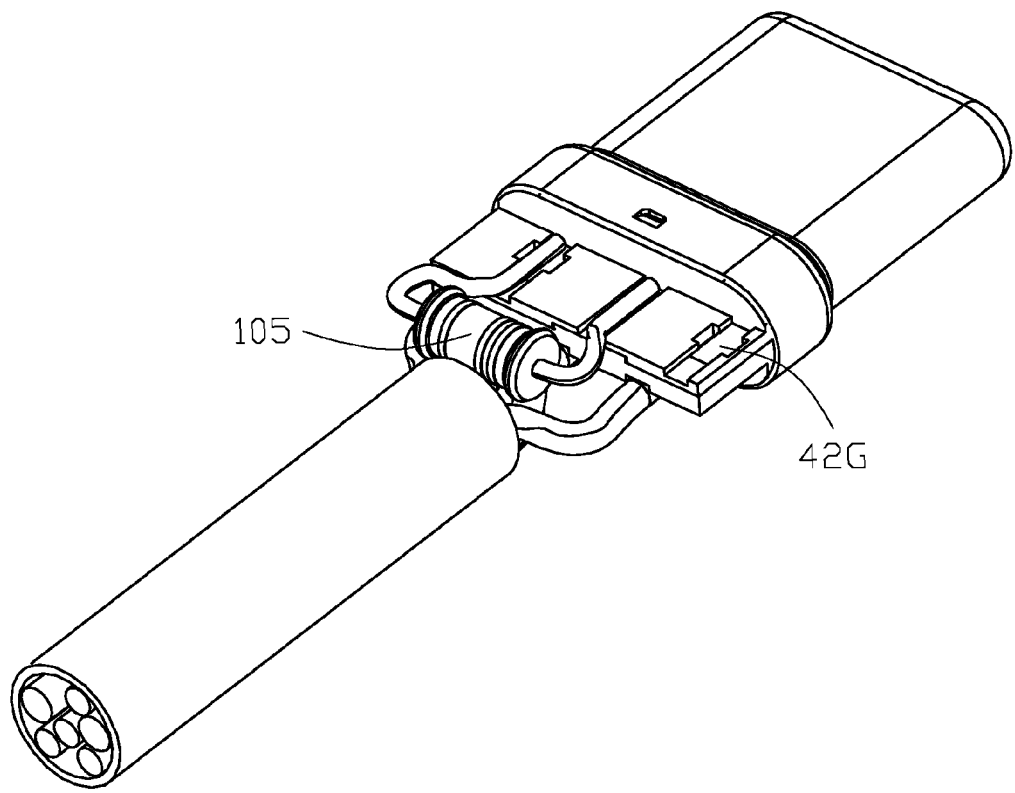
FIG. 6 is a perspective view of the plug connector with the resistor connecting with another two soldering legs, shown in FIG. 4.

Referring to FIGS. 3-4, the cable 102 includes five wires, a power wire 102P, a pair of USB 2.0 wires 102D and a grounding wire 102G arranged in a first row and welded to the first soldering legs in the first supporting face 221 of the platform 22, and a detecting wire 102C in separated from the first row and welded to the detecting soldering leg 32C on the second supporting surface 222. Said cable plug is adapted to be used in a USB Type C to USB Type C cable assembly. The second power soldering leg 42P and the second grounding soldering leg 42G is unused. FIG. 5 shows another situation of the connector used in a USB Type C to USB Type B cable assembly or a USB Type C to USB Type A receptacle adaptor, the grounding soldering leg 42G and the detecting soldering leg 42C are soldered with a resister 105. FIG. 6 shows another situation of the connector used in a USB Type A to USB Type C cable assembly or a USB Type B receptacle to USB Type C Adaptor, the power soldering leg 42P and the detecting soldering leg 42 C are solder with a resister 106. When the connector is used to a power only cable assembly, the USB 2.0 signal terminals can be omitted. Referring to FIGS. 2 and 3, the first supporting surface and the second supporting surface respectively defines corresponding recesses through the platform in the front and rear direction, partitioned with a plurality of rib walls. The wires of the cable and soldering legs of the resister are received in the recesses one by one. Therefore, the wires and soldering legs of the resister are limited in the recess, for welding facility. The soldering legs are flushed with the bottom surfaces of the recesses.

Figure 17:
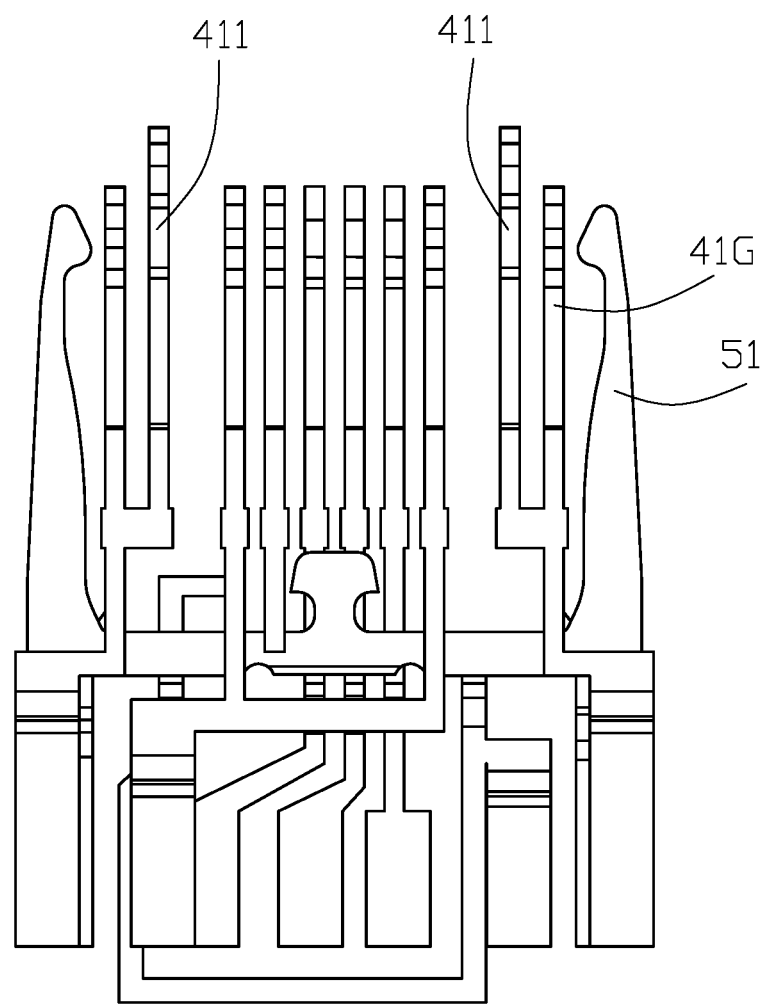
FIG. 17 is a top plane view of the terminals and the metallic latch shown in FIG. 16.

Referring to FIGS. 15-16, The first contacting sections 31 further includes two additional grounding contacting sections 311 which are used to contact corresponding grounding collars defined on the receptacle connector. The additional grounding contacting sections 311 unitarily extends from the first grounding terminals, and lie alongside the first grounding contacting sections. In a front and rear direction, the additional grounding contacting sections extend forwards compared with the first grounding contacting sections as best shown in FIG. 17 and in the vertical direction the additional grounding contacting sections 31 are far away from the mating cavity 21 compared with the first grounding contacting sections as best shown in FIG. 10. The first terminals 30 are formed by stamping from a metallic strip, all terminals are side connected by bridge portions and then the bride portions are cut away to remain a plurality of cutting face 34 as best shown in FIG. 15. The second contact 40 also further includes additional grounding contacting sections 411 which are same to the first grounding contacting sections 311.

Figure 12:
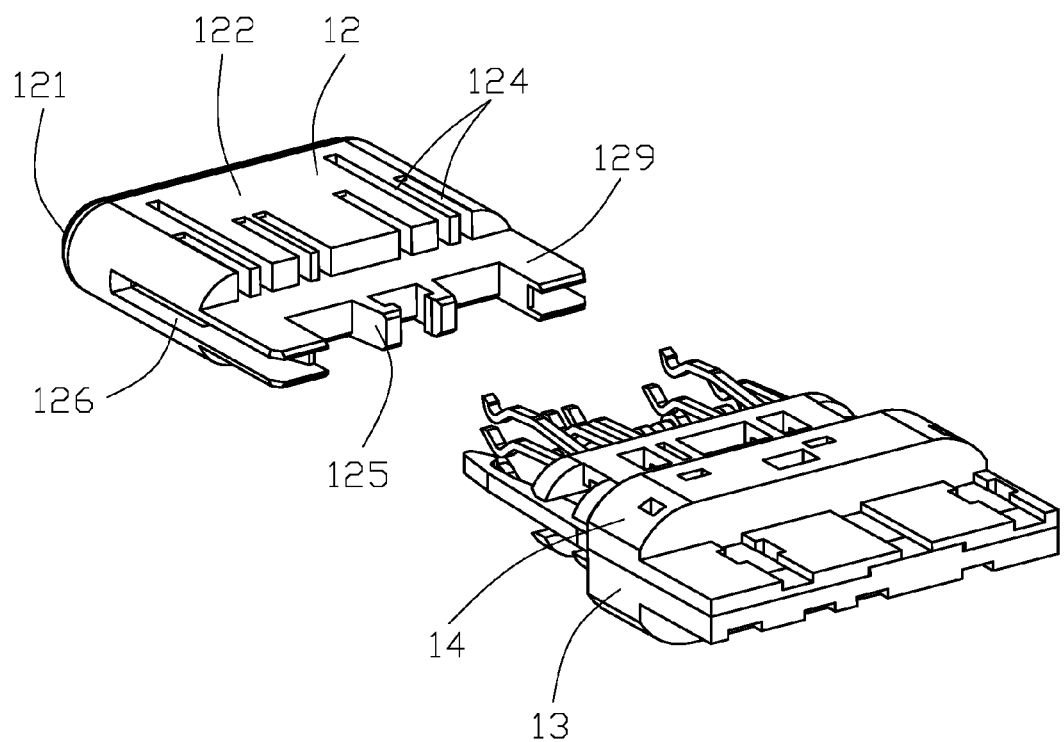
FIG. 12 is a further rear exploded perspective view of insulating housing shown in FIG. 8.

The making process of the plug connector 100 will be described hereinafter. As shown in FIGS. 12-14, the connector body 100 includes an insulating front housing 12, a first terminal module 13 and a second terminal module 14. The front housing 12 defines the mating cavity 21 running through a front end 121 thereof and a plurality of terminal passageways 124 running through the front housing in the vertical direction, and a flat board 123 extend rearwards from a rear wall 129 thereof. The first terminal module 13 includes an upper insulator 131 integrally formed with a plurality of first terminals 30 via an insert-molding process, and the second terminal module 14 includes a lower insulator 141 integrally formed with a plurality of second contact 40 via another insert-molding process. The first insulator 131 includes a first base 1311 and a first tongue 1312 extending forward from the first base 1311, the first contacting sections 31 extend beyond the first tongue 1312. The second insulator 141 includes a second base 1411 and a second tongue 1412 extending forward from the second base, the second contacting sections 41 extend beyond the second tongue 1412. During said insert molding processes, mold pins withstand the bridge portions and then the bridge portions are cut away through holes in the tongue. Referring to FIG. 11, the H-shaped metallic latch 50 includes the pair of side arms 51 with locking headers 511, and a beam 53 connecting with the two side arms 51, a locking boss 55 protruding forwards from a front edge of the beam 53. The flat board 123 defines a pair of hooks 125 extending rearwards. The metallic latch is sandwiched between the first and the second insulators in the vertical direction and then commonly inserted forwards into the front housing 12. The locking boss 55 is elastically retained with the pair of the hook 125. Referring to FIG. 9, the flat board 123 is sandwiched between the two tongues 1312, 1412. The first and second contacting section 31, 41 go across the terminal passageways 124 into the mating cavity 21.

Referring to FIGS. 13-14, the first and the second insulator define confronting faces 135, 145, the confronting face 135 defines two recesses 133 recessed therefrom and two positioning posts 134 in the tongue. The metallic latch 50 firstly assembled to confronting face 135 of the first terminal module 13, wherein the leg sections are received in the recesses 133 and the beam 53 is abutted against the positioning posts 134. Secondly, the second terminal module 14 is assembled to sandwich the latch 50 with the first terminal module 13, wherein the positioning posts 134 are received and retained in the positioning holes 144 defined in the confronting face 145 of the second tongue 1412. Then the first and second terminal modules with the latch 50 are forwardly inserted into the front housing 12. The side arms 51 of the latch 50 go across side passageways 126 defined at sides of the front housing 12 and into the mating cavity 21. The contacting sections 31, 41 go across the terminal passageways 124 which through the front wall of the front housing 12, into the mating cavity 21.

Referring to FIG. 9, the front housing 12 unitarily forms a protection flange 128 above a front end of each terminal passageways 124 so that the front ends of contacting sections 31, 41 are located inside of the protection flanges 128. When the mating cavity 21 is inserted with a mating tongue of the receptacle connector, the contacting sections will be pushed outwards and separate from the metallic shell 60 fitly surrounding the front housing 12 and the insulators, by the protection flanges 128. The front housing 12 has no flanges according to the additional grounding contacting sections 311, 411 as best shown in FIG. 10.

Referring to FIGS. 13-14, the leg sections of grounding terminals, the power terminals are exposed to the confronting faces 135, 145. After the two terminal modules assembled together, the exposed faces of the leg sections are stacked with each other. The platform 22 further intentionally defines some tine slits 23 beside the power soldering leg and the grounding soldering leg so as to allow solder material to be filled therein to join the corresponding leg sections, and to join the corresponding leg sections together when a soldering process is applied through a hot bar. The detecting leg section 32C are exposed to a boss portion 137 defined in the first insulator 131 which is received in a cavity 147 defined in the second insulator 141, so that the detecting leg section 32C can be shift to the lower/second supporting surface 222 while the detecting contacting section 31C is located in upper side thereof. The rear portions of the two terminal modules commonly forms the cable supporting platform 22 after assembly.

However, the disclosure is illustrative only, changes may be made in detail, especially in matter of shape, size, and arrangement of parts within the principles of the invention.

What is claimed is:

1. A plug connector comprising:
  a front housing defining a rear wall, a front mating cavity opening forwards, and a plurality of terminal passageways running through the rear wall in a front and rear direction and the front housing in a vertical direction;
  a first terminal module including a first insulator insert molded with a plurality of first terminals, the first terminals comprising first contacting sections received in the corresponding terminal passageways;
  a second terminal module including a second insulator insert molded with a plurality of second terminals, the second terminals comprising second contacting sections received in the corresponding terminal passageways; and
  a metallic shell fitly enclosing the front housing and the insulators;
  wherein the front housing unitarily defines a plurality of protection flanges, each protection flange is located above a front end of each terminal passageway and each contacting section of the first and second contact is located inside the protection flange thereby ensuring the contacting sections separating from the metallic shell during the contacting sections are pushed outwards by an insertion of a mating receptacle connector;
  wherein each of the first and second terminal modules comprise a base and a tongue from which the contacting sections extend forwards, the front housing further defines a flat board unitarily extending rearward from the rear wall thereof and the two tongues are located behind the rear wall and disposed at opposite sides of the flat board;

further comprising a metallic latch sandwiched between the two insulators, wherein the metallic latch comprises two side arms extend in two side passageways defined in the front housing with latching headers protruding into the front mating cavity, and a beam connecting with the side arms and a leg section;

wherein said plurality of first terminals comprising at least one power terminal, at least one grounding terminal;

wherein said plurality of second terminals comprising at least one power terminal, at least one grounding terminal;

wherein said plurality of first terminals and said plurality of second terminals further comprises at least one detecting terminal.

2. The plug connector as claimed in claim 1, wherein the side passageways extend rearward through the flat board.

3. The plug connector as claimed in claim 1, wherein a pair of hooks extends rearwards from the flat board and a locking boss extends forwards from the beam, the locking boss is assembled and retained with the pair of hooks.

4. The plug connector as claimed in claim 1, wherein an additional grounding contacting section extends from a grounding contact of the first terminals and the second terminals, the additional grounding contacting section extend forwards beyond a corresponding grounding contacting section of the grounding terminal and spaced from the front mating cavity in the vertical direction.

5. The plug connector as claimed in claim 4, wherein the additional grounding contacting section is received in a terminal passageway which has no protection flange.

6. A plug connector adapted for connecting with a cable;
a housing defining a front mating cavity and a rear cable supporting platform with opposite first and second supporting surfaces;
a plurality of first terminals and second terminals, comprising contacting sections located at opposite sides of the front mating cavity and soldering legs exposed to the rear cable supporting platform;
wherein the first supporting surface is located with a pair of USB 2.0 signal soldering legs, a first power soldering leg and a first grounding soldering leg; the second supporting surface is located with a detecting soldering leg, a second power soldering leg and a second grounding soldering leg;
wherein the contacting sections of the first terminals comprise a pair of USB 2.0 signal contacting sections, a pair of first power contacting sections and a pair of first grounding contacting sections and a detecting contacting sections, the contacting sections of the second terminals comprise a pair of second power contacting sections and a pair of second grounding contacting sections; the first power soldering leg unitarily extends from the pair of first power contacting section, the second power soldering section unitarily extends from the pair of second power contacting sections;
further comprising a metallic latch sandwiched between two insulators, wherein the metallic latch comprises two side arms extend in two side passageways defined in the housing with latching headers protruding into the front mating cavity, and a beam connecting with the side arms and a leg section;
wherein said plurality of first terminals and second terminals comprising at least one power terminal, at least one grounding terminal, at least one detecting terminal;
wherein one resister is connected between the detecting soldering leg and one of said second power soldering leg and said second ground soldering leg.

7. The plug connector as claimed in claim 6, wherein the second grounding soldering leg extends from the pair of the second grounding contacting sections.

8. The plug connector as claimed in claim 6, wherein the first and second supporting surface defines a plurality of recesses and the corresponding soldering legs are received and limited in the recesses, respectively.

9. A plug connector comprising;
an insulative housing defining a front mating cavity; and
a row of first terminals comprising a plurality of first contacting sections and first leg sections, the first contacting sections comprising a pair of first grounding contacting sections;
wherein the first contacting sections further comprise two additional grounding sections, each additional grounding section integrally extends forward from a middle section jointed between the first contacting section and the first leg section of the corresponding first terminal, the additional grounding sections extend forward beyond the first grounding contacting sections in a front and rear direction and outwardly in the front mating cavity in a vertical direction compared with the first grounding contacting section;
further comprising a row of second terminals, wherein the second terminals comprise a plurality of second contacting sections and second leg sections, the second contacting sections comprising a pair of second grounding contacting sections;
wherein the second contacting sections further comprise two additional grounding sections, each additional grounding section integrally extends forward from a middle section jointed between the second contacting section and the second leg section of the second terminal, the additional grounding sections extend forward beyond the second grounding contacting sections in the front and rear direction and outwardly in the front mating cavity in the vertical direction compared with the second grounding contacting section;
wherein said plurality of first terminals comprising at least one power terminal, at least one grounding terminal;
wherein said plurality of second terminals comprising at least one power terminal, at least one grounding terminal;
where said plurality of first terminals and said plurality of second terminals further includes at least one detecting terminal.

* * * * *